United States Patent
Kim et al.

(10) Patent No.: US 8,053,751 B2
(45) Date of Patent: Nov. 8, 2011

(54) PHASE-CHANGE SEMICONDUCTOR DEVICE AND METHODS OF MANUFACTURING THE SAME

(75) Inventors: Tae-Won Kim, Hwaseong-si (KR); Yong-Sun Ko, Suwon-si (KR); Ki-Jong Park, Yongin-si (KR); Kyung-Hyun Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/591,531

(22) Filed: Nov. 23, 2009

(65) Prior Publication Data

US 2010/0072446 A1    Mar. 25, 2010

Related U.S. Application Data

(62) Division of application No. 11/482,760, filed on Jul. 10, 2006, now Pat. No. 7,745,341.

(30) Foreign Application Priority Data

Jul. 12, 2005  (KR) .................. 10-2005-0062487

(51) Int. Cl.
*H01L 21/4763* (2006.01)

(52) U.S. Cl. .................................. 257/2; 257/E45.002

(58) Field of Classification Search .............. 257/2–9, 257/758, E45.002
See application file for complete search history.

(56) References Cited

U.S. PATENT DOCUMENTS

| | | | |
|---|---|---|---|
| 5,869,843 A | 2/1999 | Harshfield | |
| 6,236,059 B1 | 5/2001 | Wolstenholme et al. | |
| 6,579,760 B1 | 6/2003 | Lung | |
| 6,989,313 B2 * | 1/2006 | Park | 438/393 |
| 7,244,673 B2 * | 7/2007 | Huang et al. | 438/622 |
| 7,285,813 B2 * | 10/2007 | Park | 257/296 |
| 7,372,154 B2 * | 5/2008 | Tanaka et al. | 257/758 |
| 7,482,224 B2 * | 1/2009 | Kim et al. | 438/257 |
| 7,589,013 B2 * | 9/2009 | Min et al. | 438/622 |
| 2004/0251549 A1 * | 12/2004 | Huang et al. | 257/758 |
| 2005/0029503 A1 | 2/2005 | Johnson | 257/4 |
| 2005/0062087 A1 | 3/2005 | Chen et al. | 257/295 |
| 2005/0127347 A1 * | 6/2005 | Choi et al. | 257/2 |
| 2005/0140020 A1 * | 6/2005 | Bae | 257/774 |
| 2005/0167841 A1 * | 8/2005 | Papa Rao et al. | 257/758 |
| 2005/0250316 A1 * | 11/2005 | Choi et al. | 438/637 |
| 2005/0263801 A1 | 12/2005 | Park et al. | 257/288 |
| 2006/0006981 A1 * | 1/2006 | Seo et al. | 338/320 |
| 2006/0011902 A1 | 1/2006 | Song et al. | 257/4 |

(Continued)

FOREIGN PATENT DOCUMENTS

JP             07-074175           3/1995

(Continued)

*Primary Examiner* — Nathan Ha
(74) *Attorney, Agent, or Firm* — Harness, Dickey & Pierce, P.L.C.

(57) ABSTRACT

In a phase-change semiconductor device and methods of manufacturing the same, an example method may include forming a metal layer pattern on a substrate, the metal layer pattern including an opening that exposes a portion of the substrate, forming an etch stop layer on the metal layer pattern, a sidewall of the opening and the exposed portion of the substrate, the etch stop layer formed with a thickness less than an upper thickness threshold, and reducing at least a portion of the etch stop layer, the reduced portion of the etch stop layer forming an electrical connection with the substrate.

4 Claims, 10 Drawing Sheets

U.S. PATENT DOCUMENTS

| | | | |
|---|---|---|---|
| 2006/0138463 A1* | 6/2006 | Kim et al. | 257/202 |
| 2006/0163734 A1* | 7/2006 | Thei et al. | 257/758 |
| 2006/0175599 A1 | 8/2006 | Happ | 257/4 |
| 2006/0273297 A1 | 12/2006 | Happ | 257/4 |
| 2006/0284158 A1* | 12/2006 | Lung et al. | 257/2 |
| 2007/0069402 A1 | 3/2007 | Johnson | 257/E29.17 |
| 2007/0190696 A1 | 8/2007 | Happ | 438/128 |
| 2007/0197664 A1 | 8/2007 | Steiner et al. | 514/649 |

FOREIGN PATENT DOCUMENTS

| | | |
|---|---|---|
| KR | 10-0426000 | 3/2004 |
| KR | 1020050009426 | 1/2005 |

* cited by examiner

PHASE-CHANGE SEMICONDUCTOR DEVICE AND METHODS OF MANUFACTURING THE SAME

PRIORITY STATEMENT

This application is a divisional of application Ser. No. 11/482,760, filed Jul. 10, 2006 now U.S. Pat. No. 7,745,341, which claims priority under 35 USC §119 TO Korean Patent Application No. 2005-62487 filed on Jul. 12, 2005, the contents of each of which are herein incorporated by reference in their entirety.

BACKGROUND OF THE INVENTION

1. Field of the Invention

Example embodiments of the present invention relate to a semiconductor device and methods of manufacturing the same, and more particularly, to a phase-change semiconductor memory device and methods of manufacturing the same.

2. Description of the Related Art

Semiconductor devices such as dynamic random access memory (DRAM) devices, static random access memory (SRAM) devices, flash memory devices, etc. may be included in various electric and/or electronic apparatuses. Semiconductor devices may generally be classified as volatile memory devices or nonvolatile memory devices. Volatile memory devices may lose data stored therein when a power supply is turned off or drops below a voltage threshold, whereas nonvolatile memory devices may maintain data stored therein even after a power supply is turned off or drops below a voltage threshold. In an example, nonvolatile memory devices such as flash memory devices may be employed within digital cameras, MP3 players, cellular phones, etc., to maintain data integrity without a constant power supply.

Conventional flash memory devices may have longer read access and programming times as compared to random access memory (RAM) devices. A ferroelectric random access memory (FRAM) device, a magnetic random access memory (MRAM) device, a phase-change random access memory (PRAM) device, etc. may be employed which may have faster read access and programming times than flash memory devices.

Conventional PRAM devices may include a phase-change material which may alternate between a crystalline structure and an amorphous structure in accordance with heat generated by electrical power or current. An example of conventional phase-change materials which may be included in a PRAM device may include a chalcogenide alloy. The chalcogenide alloy may include a mixture of germanium (Ge), antimony (Sb) and tellurium (Te), and may be referred to as a "GST".

Conventional PRAM devices may include a phase-change layer configured to receive an electric current. A crystalline phase of the phase-change material may be adjusted based on a current level and a duration of the received electric current. Conventional PRAM devices may have a resistance which may vary based on a phase of the phase-change material, such that the crystalline and amorphous phases are each associated with different resistances. For example, the phase-change material in the crystalline phase may have a lower resistance than the phase-change material in the amorphous phase. The difference in the resistances of the crystalline and amorphous phases of the phase-change material may allow the PRAM device to be associated with one of a first logic level (e.g., a higher logic level) and a second logic level (e.g., a lower logic level). Examples of PRAM devices are well known in the art.

FIG. 1 is a cross-sectional view illustrating a phase change memory cell of a conventional PRAM device.

Referring to FIG. 1, the PRAM device may include a semiconductor substrate 10, an insulating interlayer pattern 11 formed on the semiconductor substrate 10, a contact plug 14 formed within the insulating interlayer pattern 11, a first insulation layer pattern 20a formed on the insulating interlayer pattern 11, a metal layer pattern 30a formed within the first insulation layer pattern 20a, a second insulation layer pattern 34b formed on the first insulation layer pattern 20a, a contact electrode 40a formed within the second insulation layer pattern 34b, a phase-change layer pattern 44a formed on the second insulation layer pattern 34b, an upper electrode 48a formed on the phase-change layer pattern 44a and a third insulation layer pattern 52a formed on the upper electrode 48a.

Referring to FIG. 1, the contact plug 14 may contact an impurity region (not shown) of the semiconductor substrate 10. The metal layer pattern 30a may contact the contact plug 14. The metal layer pattern 30a may electrically connect the contact electrode 40a to the contact plug 14. A spacer S may be formed within the second insulation layer pattern 34b to surround the contact electrode 40a.

Referring to FIG. 1, the metal layer pattern 30a may be formed by a damascene process such that a void V or a seam may be generated in the metal layer pattern 30a. The void V may be generated below the contact electrode 40a and/or the phase-change layer pattern 44a and may be characterized by a higher electrical resistance than other portions of the metal layer pattern 30a. The void V may at least partially isolate the contact electrode 40a from the metal layer pattern 30a.

Referring to FIG. 1, the metal layer pattern 30a may alternatively be formed by a dry etching process. In conventional dry etching processes, a hard mask pattern (not shown) may be formed on the metal layer 30a. The metal layer 30a may be dry-etched using the hard mask pattern as an etching mask. The dry etching process may reduce an occurrence of the void V in conventional PRAM devices.

Referring to FIG. 1, while the dry etching process may reduce an occurrence of voids, various problems may be associated with the above-described dry etching process. For example, the hard mask pattern (not shown) may remain on the metal layer pattern 30a with a thickness greater than about 3,000 Å after the dry etching process. Thus, if the contact electrode 40a is formed through the hard mask pattern and the second insulation layer pattern 34b, the contact electrode 40a may not be formed with a desired resistance. The hard mask pattern and the second insulation layer pattern 34b, which may have uniform thicknesses, may thereby not be formed. The contact electrode 40a may not be uniformly formed at a given height through the hard mask pattern and the second insulation layer pattern 34b. Furthermore, a contact hole for forming the contact electrode 40a may not be formed through the hard mask pattern and the second insulation layer pattern 34b with higher levels of accuracy. The spacer S may also not be formed through the hard mask pattern and the second insulation layer pattern 34b. Accordingly, it may be more difficult to control an electrical current through the contact electrode 40a, which may degrade an operational performance of conventional PRAM devices.

SUMMARY OF THE INVENTION

An example embodiment of the present invention is directed to a method of manufacturing a phase-change semiconductor device, including forming a metal layer pattern on a substrate, the metal layer pattern including an opening that exposes a portion of the substrate, forming an etch stop layer on the metal layer pattern, a sidewall of the opening and the exposed portion of the substrate, the etch stop layer formed with a thickness less than an upper thickness threshold, and reducing at least a portion of the etch stop layer, the reduced portion of the etch stop layer forming an electrical connection with the substrate.

Another example embodiment of the present invention is directed to a method of manufacturing a phase-change semiconductor device, including forming a metal layer on a substrate, forming an etch stop layer on the metal layer, the etch stop layer having a thickness less than an upper thickness threshold, forming a photoresist pattern on the etch stop layer, etching the etch stop layer and the metal layer using the photoresist pattern to form an etch stop layer pattern and a metal layer pattern on the substrate and to form an opening exposing a portion of the substrate, and reducing the photoresist pattern.

Another example embodiment of the present invention is directed to a phase-change semiconductor device, including a substrate, a metal layer pattern on the substrate, the metal layer pattern including an opening that exposes a portion of the substrate, an etch stop layer formed on the metal layer pattern, the etch stop layer formed with a thickness less than an upper thickness threshold and a conductive path formed in an opening in the etch stop layer and the metal layer pattern, the conductive path providing an electrical connection to the substrate.

Example embodiments of the present invention provide a method of manufacturing a phase-change semiconductor device including a contact electrode having a uniform resistance.

Another example embodiment of the present invention is directed to a method of manufacturing a phase-change semiconductor device, including forming a metal layer pattern on a substrate. The metal layer pattern may include an opening that exposes a portion of the substrate. An etch stop layer may be formed on the metal layer pattern, a sidewall of the opening and the exposed portion of the substrate, and then an oxide layer pattern may be formed to at least partially fill the opening. After an insulation layer is formed on the etch stop layer and the oxide layer pattern, a contact hole may be formed through the insulation layer and the etch stop layer to expose a portion of the metal layer pattern. A contact electrode may be formed to at least partially fill the contact hole. After a phase-change layer is formed on the insulation layer and the contact electrode, an upper electrode layer may be formed on the phase-change layer. The upper electrode layer and the phase-change layer may be successively patterned using a mask pattern. As a result, the phase-change semiconductor device including the contact electrode having a uniform resistance may be obtained.

In another example embodiment of the present invention, the metal layer pattern may be formed by forming a metal layer on the substrate, by forming a photoresist pattern on the metal layer, by partially removing the metal layer using the photoresist pattern as an etching mask, and by removing the photoresist pattern.

In another example embodiment of the present invention, the etch stop layer may be formed using silicon nitride, silicon oxynitride or silicon-rich silicon oxide that has a content of silicon substantially greater than that of the oxide layer pattern. The etch stop layer may have a thickness of about 100 Å to about 2,000 Å.

In another example embodiment of the present invention, the oxide layer pattern may be formed by forming an oxide layer to at least partially fill the opening and to cover the etch stop layer and by performing a planarization process on the oxide layer until an upper face of the etch stop layer is exposed.

In another example embodiment of the present invention, a spacer may be formed on a sidewall of the contact hole.

Another example embodiment of the present invention is directed to a method of manufacturing a phase-change semiconductor device, including forming a metal layer on a substrate. An etch stop layer may be formed on the metal layer, and then a photoresist pattern may be formed on the etch stop layer. The etch stop layer and the metal layer may be successively etched using the photoresist pattern to form an etch stop layer pattern and a metal layer pattern on the substrate, and to form an opening exposing a portion of the substrate. An oxide layer pattern may be formed to at least partially fill the opening. After an insulation layer is formed on the etch stop layer pattern and the oxide layer pattern, a contact hole may be formed through the insulation layer and the etch stop layer. The contact hole may expose a portion of the metal layer pattern. A contact electrode may be formed to at least partially fill the contact hole. The contact electrode may be electrically connected to the metal layer pattern. After a phase-change layer is formed on the insulation layer, an upper electrode layer may be formed on the phase-change layer. The upper electrode layer and the phase-change layer may be successively patterned using a mask pattern. As a result, the phase-change semiconductor device including the contact electrode having a uniform resistance may be obtained.

In another example embodiment of the present invention, a metal layer pattern may be formed by etching a metal layer using a photoresist pattern, and then an etch stop layer having a uniform thickness is formed on the metal layer pattern. Thus, a contact electrode having a desired height may be obtained. A thickness of an insulation layer successively formed on the etch stop layer may be easily controlled, and the height of the contact electrode may be adjusted. As a result, the contact electrode having a desired electrical resistance may be obtained. Therefore, a phase-change semiconductor device including the contact electrode having a uniform resistance may have enhanced electrical characteristics in programming and erasing operations.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention.

DESCRIPTION OF EXAMPLE EMBODIMENTS OF THE PRESENT INVENTION

Figure 1:
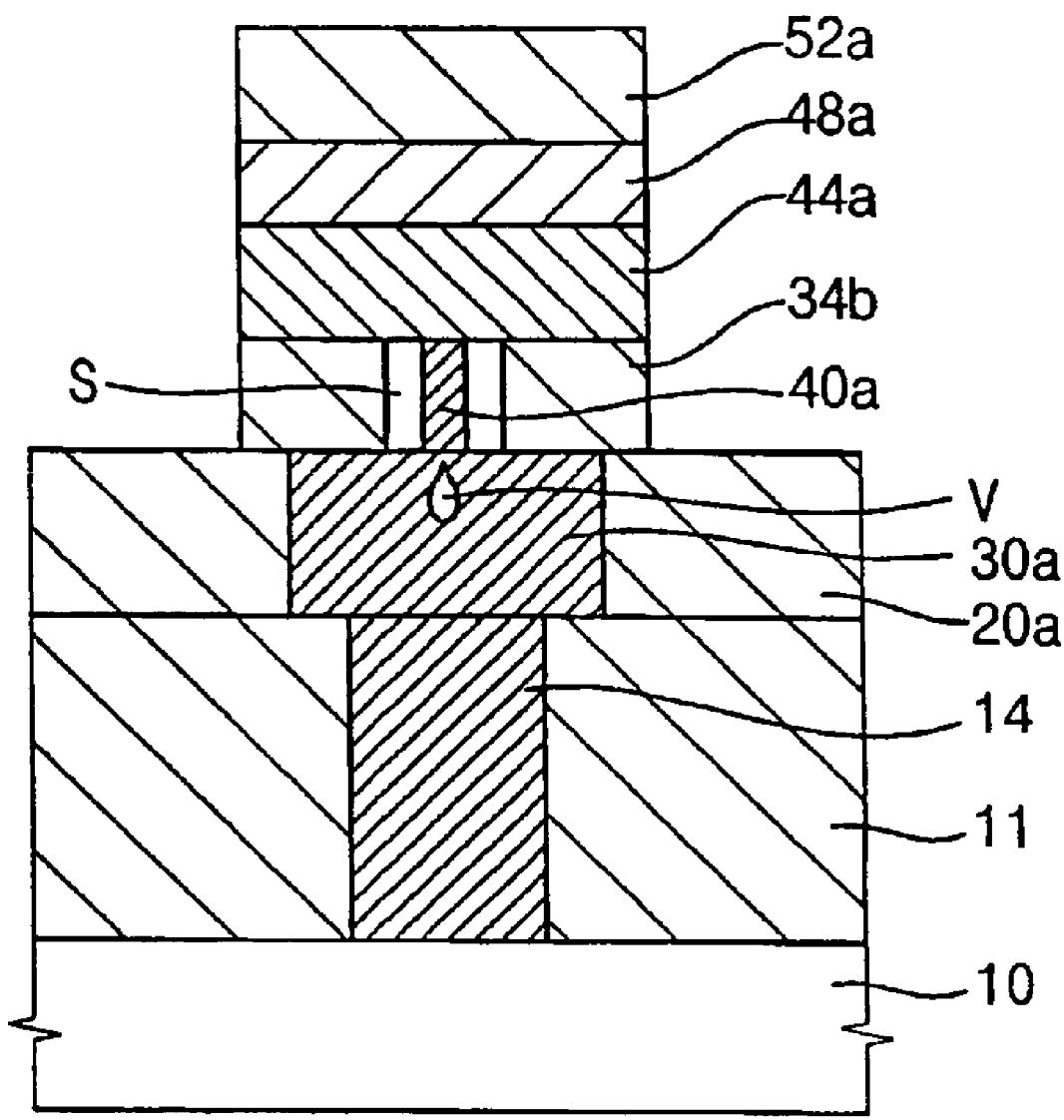
FIG. 1 is a cross-sectional view illustrating a phase change memory cell of a conventional PRAM device.

Example embodiments of the present invention are described more fully hereinafter with reference to the accompanying drawings, in which example embodiments of the present invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
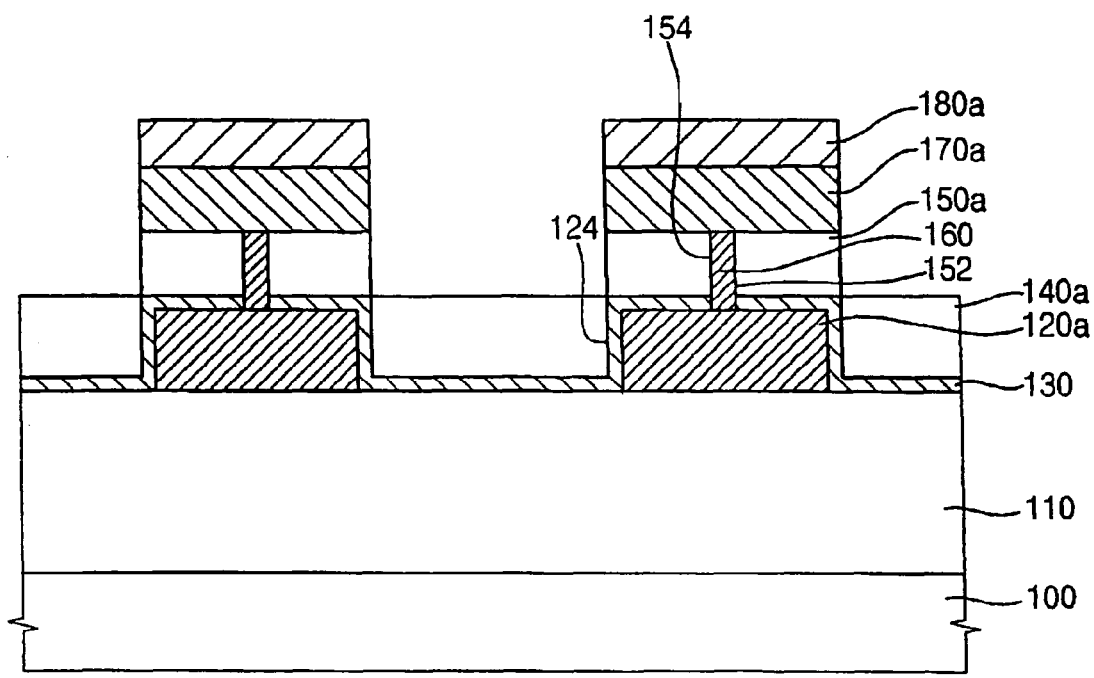
FIG. 2 is a cross-sectional view illustrating a phase-change semiconductor device according to an example embodiment of the present invention.

FIG. 2 is a cross-sectional view illustrating a phase-change semiconductor device according to an example embodiment of the present invention.

In the example embodiment of FIG. 2, the phase-change semiconductor device may include a semiconductor substrate 100, a first insulation layer 110 formed on the semiconductor substrate 100, a metal layer pattern 120a formed on the first insulation layer 110, an etch stop layer 130 formed on an upper face and a sidewall of the metal layer pattern 120a and the first insulation layer 110, a second insulation layer pattern 140a formed between adjacent metal layer patterns 120a, a third insulation layer pattern 150a formed on the metal layer pattern 120a, a contact electrode 160 formed through the etch stop layer 130 and the third insulation layer pattern 150, a phase-change layer pattern 170a formed on the third insulation layer pattern 150a, and an upper electrode 180a formed on the phase-change layer pattern 170a.

In the example embodiment of FIG. 2, the first insulation layer 110 may be formed on the semiconductor substrate 100 with or without an intervening layer or layers. The first insulation layer 110 may include a contact plug (not shown) electrically connected to the semiconductor substrate 100. In an example, the first insulation layer 110 may include an oxide (e.g., boro-phosphor silicate glass (BPSG), phosphor silicate glass (PSG), undoped silicate glass (USG), spin-on glass (SOG), tetraethyl orthosilicate (TEOS), etc.).

In the example embodiment of FIG. 2, the metal layer pattern 120a may be formed on the first insulation layer 110 and may be electrically connected to the contact plug (not shown). In an example, the metal layer pattern 120a may include a conductive material (e.g., one or more of titanium (Ti), aluminum (Al), tungsten (W), tantalum (Ta), tantalum nitride (TaN), etc.).

In the example embodiment of FIG. 2, the etch stop layer 130 may be formed on the upper face and the sidewall of the metal layer pattern 120a and on the first insulation layer 110. The etch stop layer 130 may include a contact hole in which the contact electrode 160 may be formed. In an example, the etch stop layer 130 may include silicon nitride, silicon oxynitride and/or silicon-rich silicon oxide. In a further example, the silicon-rich silicon oxide may have a content level of silicon greater than that of other silicon oxides.

In the example embodiment of FIG. 2, the etch stop layer 130 may be used as an etching and/or polishing stopper in an etching process and/or a polishing process for forming the second insulation layer pattern 140a. The etch stop layer 130 may not function as an etching mask in a process of forming the second insulation layer pattern 140a. In an example, the etch stop layer 130 may have a thickness less than or equal to an upper thickness threshold (e.g., about 3,000 Å), which may allow greater control of a thickness of the third insulation layer pattern 150a. In a further example, the etch stop layer 130 may have a thickness between about 100 Å and about 2,000 Å. In yet another example, the thickness of the etch stop layer 130 may be in a range between about 200 Å and about 1,500 Å.

In the example embodiment of FIG. 2, if the etch stop layer 130 has a thickness which is less than or equal to the upper thickness threshold (e.g., about 3,000 Å), the contact electrode 160 may achieve a uniform resistance and/or height at given respective levels (e.g., levels sufficient for deployment in a PRAM). If the uniform resistance and/or height of the contact electrode 160 are greater than a resistance threshold and/or a height threshold, a current delay of current flowing through the contact electrode 160 may be generated.

In the example embodiment of FIG. 2, the etch stop layer 130 may be used for forming the contact electrode 160 at a uniform height so as to enhance electrical characteristics of the phase-change semiconductor device, for example by improving a performance of programming and/or erasing operations of the phase-change semiconductor device.

In another example embodiment of the present invention, referring to FIG. 2, the phase-change semiconductor device may include an ohmic contact layer (not shown) formed on the metal layer pattern 120a. In an example, the ohmic contact layer may include a conductive material (e.g., a nitrogen-containing conductive material, a metal, a metal silicide, etc.). Examples of the nitrogen-containing conductive material may include one or more of titanium nitride, tantalum nitride, molybdenum nitride, titanium silicon nitride, titanium aluminum nitride, titanium boron nitride, zirconium silicon nitride, tungsten silicon nitride, tungsten boron nitride, zirconium aluminum nitride, molybdenum silicon nitride, molybdenum aluminum nitride, tantalum silicon nitride, tantalum aluminum nitride, titanium oxynitride, titanium aluminum oxynitride, tungsten oxynitride, tantalum oxynitride, etc.

In the example embodiment of FIG. 2, the third insulation layer pattern 150a may be formed on the etch stop layer 130 positioned on the metal layer pattern 120a. The third insulation layer pattern 150a may include the contact hole (not shown) in which the contact electrode 160 may be formed. The contact hole may be formed through the third insulation layer pattern 150a and the etch stop layer 130 so as to expose a portion of the metal layer pattern 120a. The third insulation layer pattern 150a may isolate the phase-change layer pattern 170a from the metal layer pattern 120a. The third insulation layer pattern 150a may define a region in which the contact electrode 160 may be formed.

In the example embodiment of FIG. 2, the phase-change semiconductor device may further include a spacer (not shown) formed on a sidewall of the contact hole. For example, the spacer may be included if a process margin is insufficient in a photolithography process for forming the contact hole through the third insulation layer pattern 150a and the etch stop layer 130. In a further example, the contact electrode 160 may have a diameter smaller than that of the contact hole.

In the example embodiment of FIG. 2, the contact electrode 160 may be formed so as to at least partially fill the contact hole. The contact electrode 160 may be electrically connected to the metal layer pattern 120a. In an example, the height of the contact electrode 160 may be substantially equal to a sum of thicknesses of the etch stop layer 130 and the third insulation layer pattern 150a. The contact electrode 160 may function as a passage for current flowing from the metal layer pattern 120a to the phase-change layer pattern 170a. The contact electrode 160 may have a smaller diameter. Thereby, a relatively large resistance may be generated between the contact electrode 160 and the phase-change layer pattern 170a even if a relatively small current flows through the contact electrode 160. In another example, the contact electrode 160 may correspond to a lower electrode.

In the example embodiment of FIG. 2, the phase-change layer pattern 170a may be formed on the contact electrode 160 and the third insulation layer pattern 150a. In an example, the phase-change layer pattern 170a may include a chalcogenide alloy. Examples of chalcogenide alloys may include one or more of germanium-antimony-tellurium (GST), arsenic-antimony-tellurium, tin-antimony-tellurium, tin-indium-tellurium, tin-indium-antimony-tellurium, arsenic-germanium-antimony-tellurium, an element in Group 5A-antimony-tellurium, an element in Group 6A-antimony-tellurium, the element in Group 5A-antimony-selenium, the element in Group 6A-antimony-selenium, etc. Examples of Group 5A elements may include one or more of tantalum, niobium, vanadium, etc. Examples of Group 6A elements may include one or more of tungsten, molybdenum, chromium, etc.

In the example embodiment of FIG. 2, the upper electrode 180a may be formed on the phase-change layer pattern 170a. The upper electrode 180a may include a conductive material. For example, the upper electrode 180a may include substantially the same conductive material as that of the contact electrode 160.

In another example embodiment of the present invention, referring to FIG. 2, the phase-change semiconductor device may include the etch stop layer 130 with a thickness below an upper thickness threshold (e.g., about 3,000 Å) such that the contact electrode 160 may be formed having a desired, uniform resistance and/or a desired, uniform height. Thus, the phase-change semiconductor device may have enhanced electrical characteristics such as improved performance associated with programming and/or erasing operations.

FIGS. 3 to 8 are cross-sectional views illustrating a method of manufacturing the phase-change semiconductor device illustrated in FIG. 2.

Figure 3:
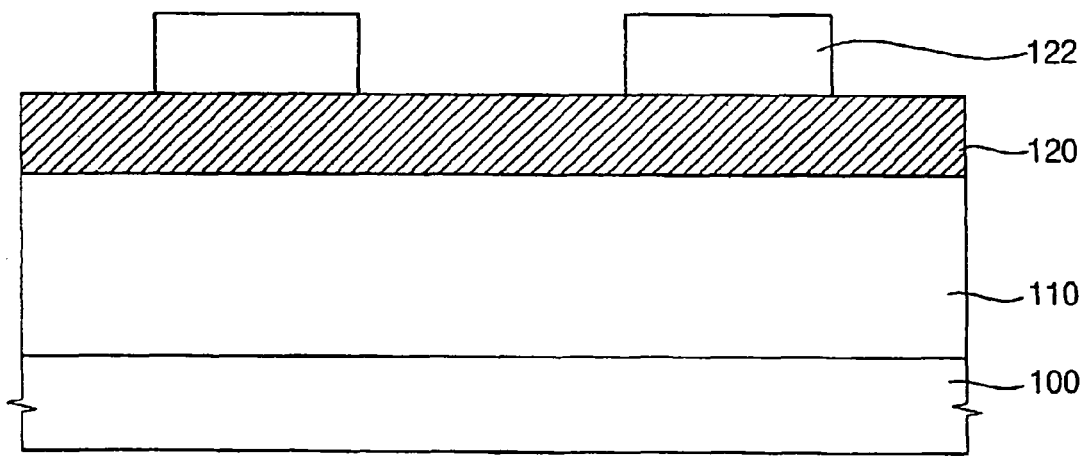
FIGS. 3 to 8 are cross-sectional views illustrating a method of manufacturing the phase-change semiconductor device illustrated in FIG. 2.

In the example embodiment of FIG. 3, a first insulation layer 110, a metal layer 120 and a first photoresist pattern 122 may formed on a semiconductor substrate 100. The first insulation layer 110 may be formed on the semiconductor substrate 100. A lower structure (not shown) may be formed on the semiconductor substrate 100. For example, the lower structure may include an isolation layer, a contact region, a transistor, a bit line and/or a contact plug. The first insulation layer 110 may be formed with an oxide including one or more of BPSG, PSG, USG, SOG, TEOS, etc. In an example, the first insulation layer 110 may be formed by a chemical vapor deposition (CVD) process, a plasma enhanced-chemical vapor deposition (PE-CVD) process, an atomic layer deposition (ALD) process and/or a high density plasma-chemical vapor deposition (HDP-CVD) process.

In the example embodiment of FIG. 3, the metal layer 120 may be formed on the first insulation layer 110. The metal layer 120 may be formed with a conductive material, for example one or more of tungsten, aluminum, copper, titanium, tantalum, tantalum nitride, etc. In an example, the metal layer 120 may be formed by a PE-CVD process and/or a sputtering process.

In the example embodiment of FIG. 3, a photoresist film may be formed on the metal layer 120 by coating the metal layer 120 with a photoresist composition. An exposure process and a developing process may be performed on the photoresist film to form the first photoresist pattern 122 on the metal layer 120. A thickness of the first photoresist pattern 122 may vary in accordance with a thickness of the metal layer 120.

Figure 4:
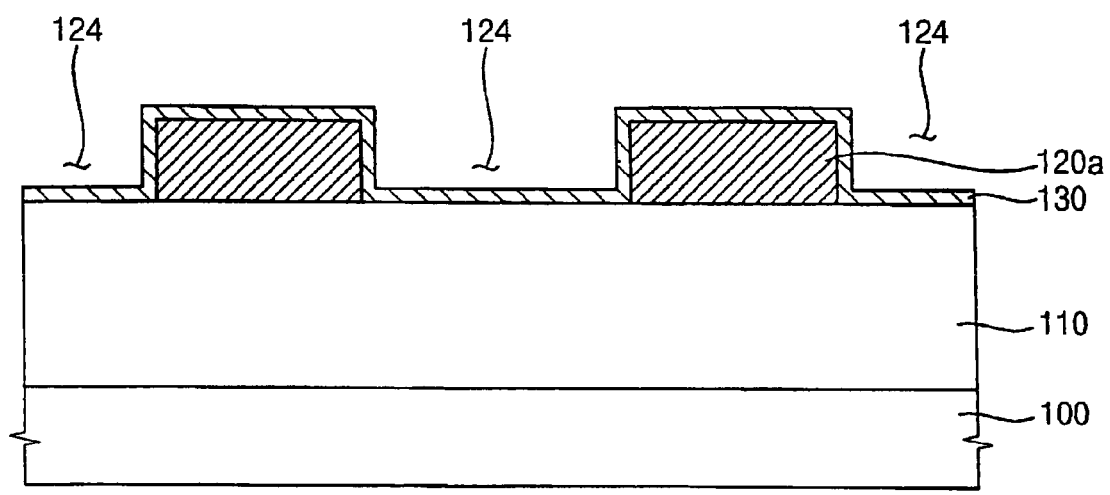

In the example embodiment of FIG. 4, the metal layer pattern 120a and the etch stop layer 130 may be formed on the first insulation layer 110. The metal layer 120 may be dry etched using the first photoresist pattern 122 as an etching mask to form the metal layer pattern 120a on the first insulation layer 100. The metal layer pattern 120a may include an opening exposing a portion of the first insulation layer 110. In an example, the first photoresist pattern 122 may be removed by an aching process and/or a stripping process.

In the example embodiment of FIG. 4, the etch stop layer 130 may be formed on an upper face and a sidewall of the metal layer pattern 120a and the exposed portion of the first insulation layer 110. In an example, the etch stop layer 130 may be formed with one or more of silicon nitride, silicon oxynitride and/or silicon-rich silicon oxide. In a further example, the silicon-rich silicon oxide may include a higher content of silicon than that of other silicon oxides.

In the example embodiment of FIG. 4, the etch stop layer 130 may function as an etching stopper in an etching process and/or a polishing stopper in a polishing process for forming the second insulation layer pattern 140a (e.g., see FIG. 5) in the opening 124. In an example, the etch stop layer 130 may not function as an etching mask in the etching process and/or the polishing process. In a further example, the etch stop layer 130 may have a thickness below the upper thickness threshold (e.g., about 3,000 Å) such that a thickness of a third insulation layer 150 (e.g., see FIG. 6) may be controlled with greater precision. In a further example, the etch stop layer 130 may have a thickness between about 100 Å and about 2,000 Å. In yet another example, the etch stop layer 130 may have a thickness between about 200 Å and about 1,500 Å.

In the example embodiment of FIG. 4, the etch stop layer 130 may have a relatively uniform thickness. Thereby, the contact electrode 160 (e.g., see FIG. 7) formed through the etch stop layer 130 and the third insulation layer 150 may have a relatively uniform height. Thus, electrical characteristics, for example, performance associated with programming and/or erasing operations of the phase-change semiconductor device, may be improved.

Figure 5:
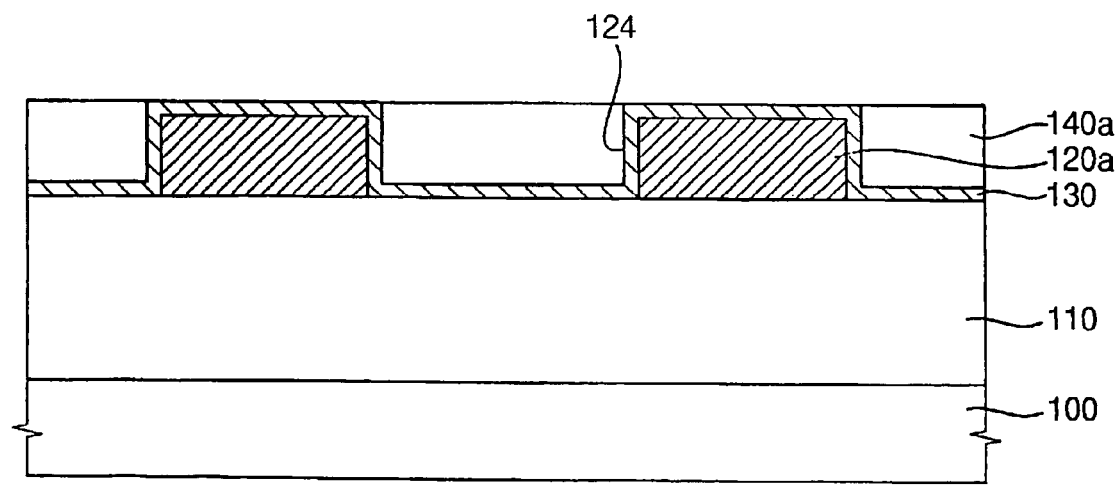

In the example embodiment of FIG. 5, the second insulation layer pattern 140a may be formed on the etch stop layer to at least partially fill the opening 124. The second insulation layer covering (e.g., at least partially) the metal layer pattern 120a may be formed on the etch stop layer 130 to at least partially fill the opening 124. In an example, the second insulation layer may include an oxide with one or more of BPSG, PSG, USG, SOG, TEOS, etc. In another example, the second insulation layer may be formed by a process substantially the same as that employed for forming the first insulation layer 110.

In the example embodiment of FIG. 5, the second insulation layer may be partially reduced (e.g., removed) until the etch stop layer 130 formed on the metal layer pattern 120a may be exposed so as to form the second insulation layer pattern 140a. In an example, the second insulation layer may be at least partially reduced (e.g., removed) by a chemical mechanical polishing (CMP) process, an etch back process or a combination process of CMP and etch back.

Figure 6:
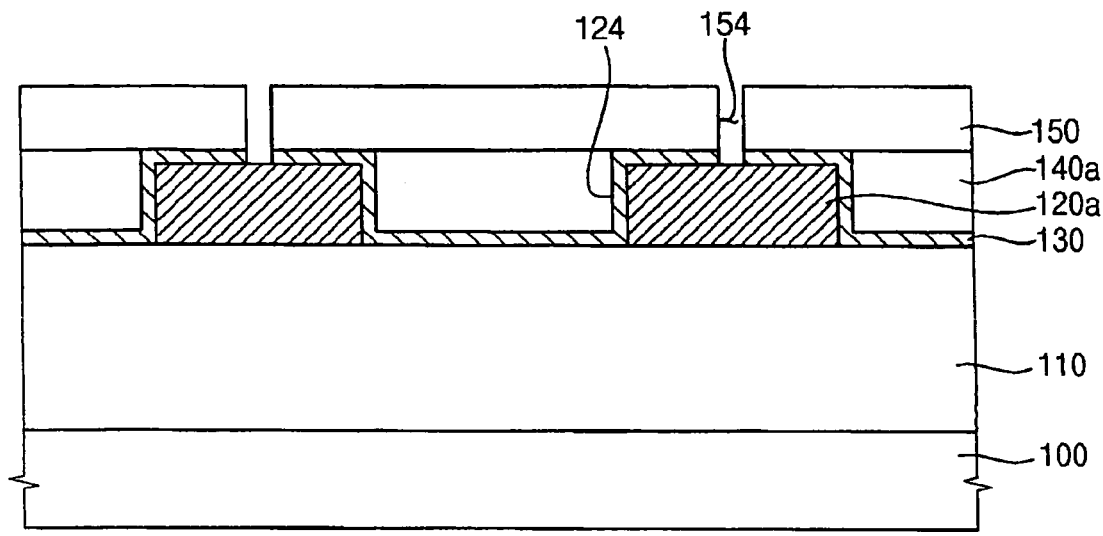

In the example embodiment of FIG. 6, a preliminary third insulation layer may be formed on the etch stop layer 130 and the second insulation layer pattern 140a. A second photoresist pattern (not shown) may be formed on the preliminary third insulation layer. The preliminary third insulation layer and the etch stop layer 130 may be partially reduced (e.g., removed) using the second photoresist pattern as an etching mask to form a contact hole 154 exposing a portion of the metal layer pattern 120a. The preliminary third insulation layer and the etch stop layer 130 may be partially reduced (e.g., removed) by a dry etching process. Thereby, the third insulation layer 150 including the contact hole 154 may be formed on the etch stop layer 130 and the second insulation layer pattern 140a. In an example, the second photoresist pattern may be reduced (e.g., removed) by an ashing process and/or a stripping process.

Figure 7:
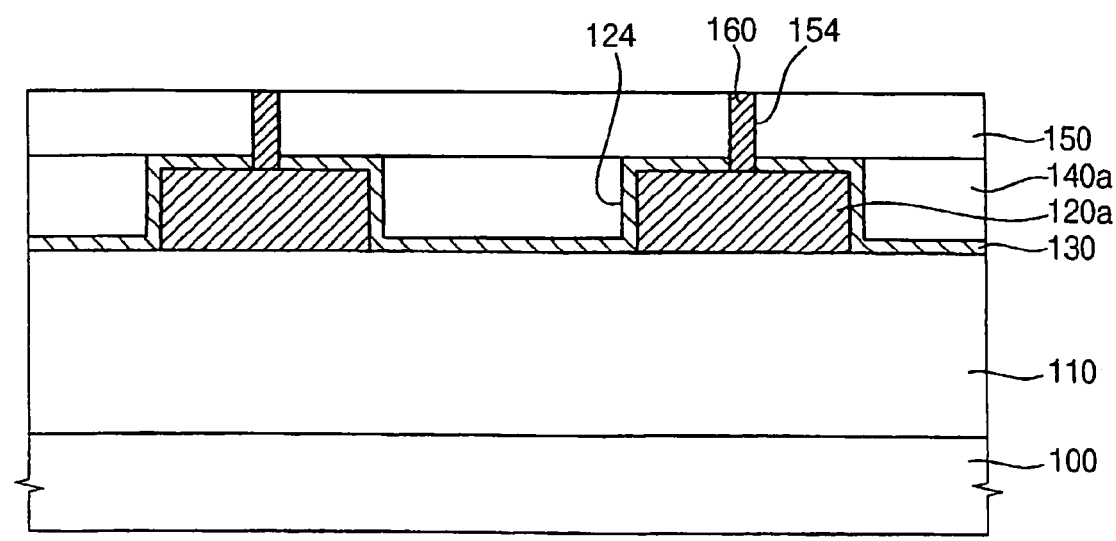

In the example embodiment of FIG. 7, the contact electrode 160 may be formed through the etch stop layer 130 and the third insulation layer 150 to at least partially fill the contact hole 154. The contact electrode 160 may contact the metal layer pattern 120a.

In the example embodiment of FIG. 7, a conductive layer may be formed on the third insulation layer 150 to at least partially fill the contact hole 154. The conductive layer may be partially reduced (e.g., removed) until the third insulation layer 150 may be exposed so as to form the contact electrode 160. In an example, the conductive layer may be partially reduced (e.g., removed) by a CMP process, an etch back process or a combination process of CMP and etch back. Thus, the contact electrode 160 electrically connected to the metal layer pattern 120a may be formed in the contact hole 154. In an example, the conductive layer may be formed using a conductive material including one or more of tantalum, copper, tungsten, titanium, aluminum or a nitride thereof. In another example, the conductive layer may be formed with a CVD process, a sputtering process and/or an ALD process.

In the example embodiment of FIG. 7, the contact electrode 160 may have a relatively high aspect ratio. Thus, an electric current received from the metal layer pattern 120a may flow through a small cross-section of the contact electrode 160 such that a lower amount of electric current may generate a higher amount of heat. For example, the generated heat may be sufficient to trigger a change of the phase change layer 170 (e.g., to/from a crystalline phase) (e.g., see FIG. 8).

Figure 8:
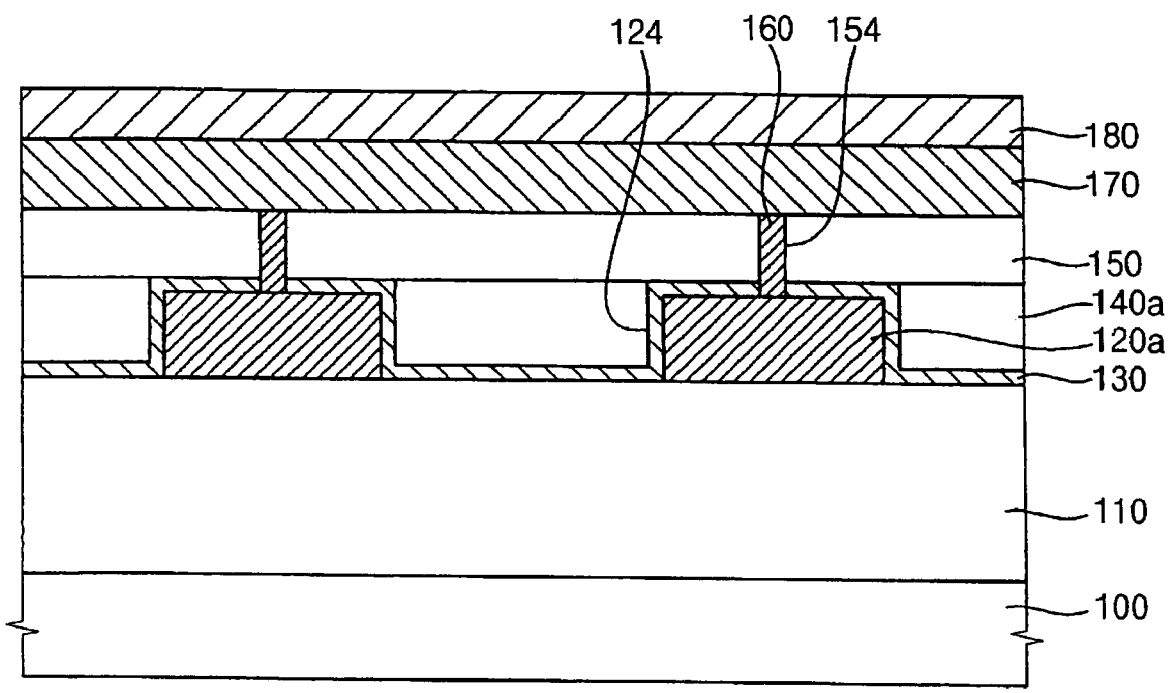

In the example embodiment of FIG. 8, the phase-change layer 170 may be formed on the third insulation layer 150 including the contact electrode 160. In an example, the phase-change layer 170 may be formed with a chalcogenide alloy by a sputtering process. Examples of the chalcogenide alloy may include one or more of germanium-antimony-tellurium (GST), arsenic-antimony-tellurium, tin-antimony-tellurium, tin-indium-tellurium, tin-indium-antimony-tellurium, arsenic-germanium-antimony-tellurium, an element in Group 5A-antimony-tellurium, an element in Group 6A-antimony-tellurium, the element in Group 5A-antimony-selenium, the element in Group 6A-antimony-selenium, etc. Examples of Group 5A elements may include tantalum, niobium, vanadium, etc. Examples Group 6A elements may include tungsten, molybdenum, chromium, etc.

In the example embodiment of FIG. 8, an upper electrode layer 180 may be formed on the phase-change layer 170 with one or more of a CVD process, a physical vapor deposition (PVD) process and an ALD process. In an example, the upper electrode layer 180 may be formed with a conductive material including one or more of a nitrogen-containing conductive material, a metal and a metal silicide. Examples of the nitrogen-containing conductive material may include one or more of titanium nitride, tantalum nitride, molybdenum nitride, titanium silicon nitride, titanium aluminum nitride, titanium boron nitride, zirconium silicon nitride, tungsten silicon nitride, tungsten boron nitride, zirconium aluminum nitride, molybdenum silicon nitride, molybdenum aluminum nitride, tantalum silicon nitride, tantalum aluminum nitride, titanium oxynitride, titanium aluminum oxynitride, tungsten oxynitride, tantalum oxynitride, etc.

In the example embodiment of FIG. 8, an etching mask (not shown) may be formed on the upper electrode layer 180. The upper electrode layer 180, the phase-change layer 170, and the third insulation layer 150 may be patterned to form an upper electrode 180a, a phase-change layer pattern 170a and a third insulation layer pattern 150a on the etch stop layer 130 positioned over the metal layer pattern 120a as illustrated in FIG. 2. Accordingly, after the patterning, a phase-change semiconductor device may be achieved.

In the example embodiment of FIGS. 2 and 8, the phase-change semiconductor device may include the contact electrode 160 formed through the third insulation layer pattern 150a, the phase-change layer pattern 170a formed on the contact electrode 160 and the third insulation layer pattern 150a, and the upper electrode 180a formed on the phase-change layer pattern 170a. Further, a fourth insulation layer may be formed on the upper electrode 180a so as to isolate the upper electrode 180a from an adjacent upper electrode.

FIGS. 9 to 16 are cross-sectional views illustrating a method of manufacturing a phase-change semiconductor device according to another example embodiment of the present invention.

Figure 9:
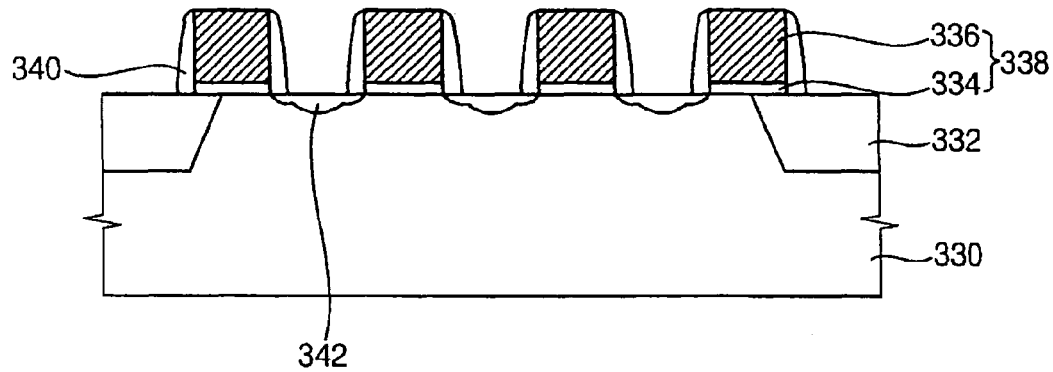
FIGS. 9 to 16 are cross-sectional views illustrating a method of manufacturing a phase-change semiconductor device according to another example embodiment of the present invention.

In the example embodiment of FIG. 9, an isolation layer 332 may be formed at an upper portion of a semiconductor substrate 330. The isolation layer 332 may be formed by an isolation process such as a shallow trench isolation (STI) process. The isolation layer 332 may divide the semiconductor substrate 330 into an active region and a field region.

In the example embodiment of FIG. 9, an insulation layer and a conductive layer may be formed on the semiconductor substrate 330. In an example, the insulation layer may be formed with one or more of oxide, metal oxide, metal oxynitride, etc. In another example, the insulation layer may be formed by an ALD process.

In the example embodiment of FIG. 9, the conductive layer may be formed with one or more of polysilicon doped with impurities (e.g., metal, conductive metal nitride, metal silicide, etc). A gate conductive layer 336 having a multi-layer structure may be formed on the semiconductor substrate 330 to enhance electrical characteristics of the phase-change semiconductor device. In an example, the conductive layer may have a multi-layer structure with both a metal layer and a metal nitride layer.

In the example embodiment of FIG. 9, the conductive layer and the insulation layer may be patterned to form a gate pattern 338 including a gate insulation layer 334 and the gate conductive layer 336 in the active region of the semiconductor substrate 330. A hard mask pattern (not shown) and/or a photoresist pattern (not shown) may be formed on the conductive layer. The conductive layer and the insulation layer may be etched using the hard mask pattern and/or the photoresist pattern. If the hard mask pattern is formed on the conductive layer, the gate pattern 338 may include the hard mask pattern formed on the gate conductive layer 336.

In the example embodiment of FIG. 9, a first ion implantation process may be performed on the semiconductor substrate 330 using the gate pattern 338 as an ion implantation mask to form lightly doped regions at portions of the semiconductor substrate 330 adjacent to the gate pattern 338.

In the example embodiment of FIG. 9, a gate spacer 340 may be formed on a sidewall of the gate pattern 338. A second ion implantation process may be performed on the semiconductor substrate 330 using the gate pattern 338 and the gate spacer 340 as ion implantation masks to form heavily doped regions (e.g., more heavily than the lightly doped regions) at portions of the semiconductor substrate 330 adjacent to the gate pattern 330. Source/drain regions 342 having lightly doped drain (LDD) structures may be formed at the portions of the semiconductor substrate 330. A bit line (not shown) may be formed over the gate pattern 38.

Figure 10:
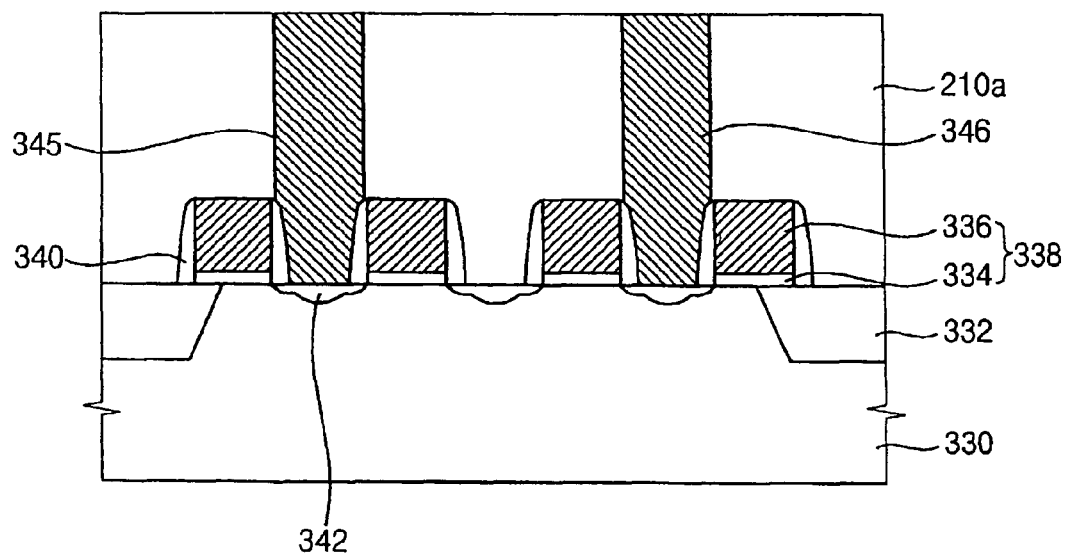

In the example embodiment of FIG. 10, a first insulating interlayer may be formed on the semiconductor substrate 330 including the gate pattern 338 thereon. The first insulation interlayer may be patterned to form a first insulation interlayer pattern 210a including openings 345 exposing the source/drain regions 342. The openings 345 may be at least partially filled with a conductive material such as doped polysilicon, metal, etc. Contact pads 346 may thereby be formed on the semiconductor substrate 330 to at least partially fill the openings 345.

In the example embodiment of FIG. 10, one or more of the contact pads 346 may be formed by a deposition process and/or by a planarization process. Examples of the planarization process may include a CMP process, an etch back process or a combination process of CMP and etch back. The contact pads 346 may include a first plug formed between adjacent gate patterns 338 and a second plug formed on the first plug.

Figure 11:
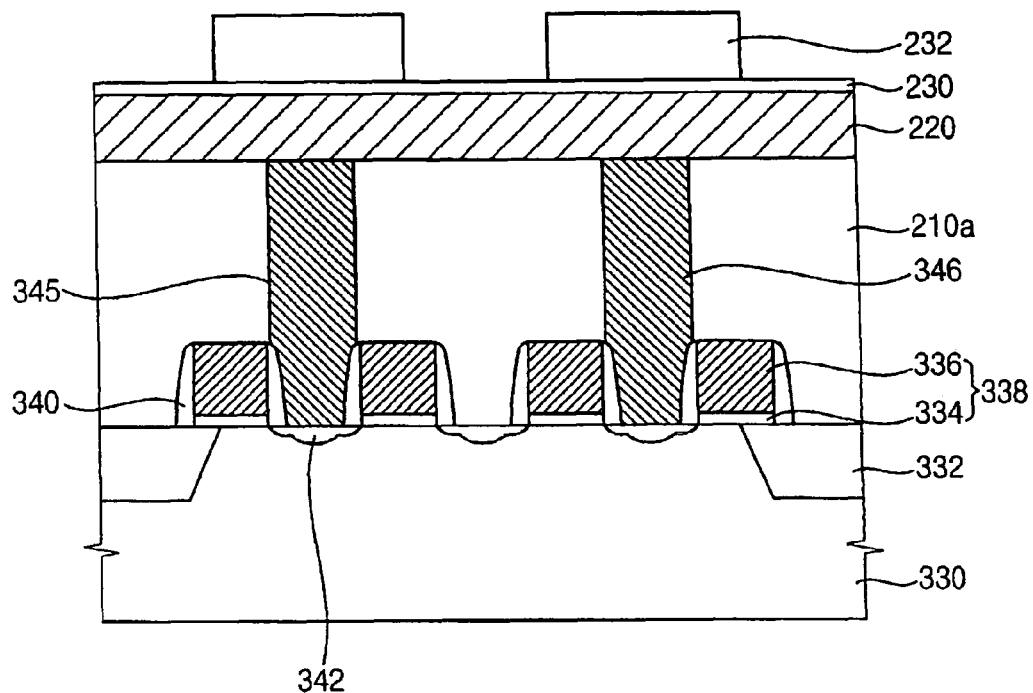

In the example embodiment of FIG. 11, a metal layer 220 may be formed on the first insulating interlayer pattern 210a and the contact pads 346. In an example, the metal layer 220 may be formed using a conductive material including one or more of tungsten, aluminum, copper, titanium, tantalum, tantalum nitride, etc. In another example, the metal layer 220 may be formed by a PE-CVD process and/or a sputtering process.

In the example embodiment of FIG. 11, an etch stop layer 230 may be formed on the metal layer 220. The etch stop layer 230 may include one or more of silicon nitride, silicon oxynitride and silicon-rich silicon oxide. In an example, the silicon-rich silicon oxide may have a higher content of silicon as compared to that of other silicon oxides. A first photoresist pattern 232 may be formed on the etch stop layer 230.

Figure 12:
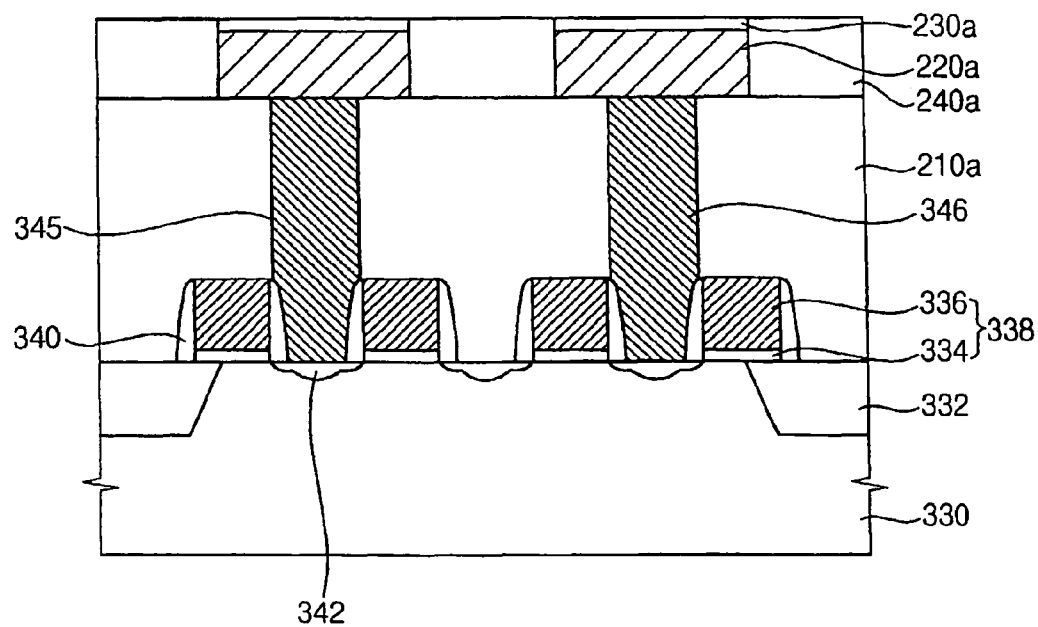

In the example embodiment of FIG. 12, the etch stop layer 230 and the metal layer 220 may be etched using the first photoresist pattern 232 as an etching mask to form an etch stop layer pattern 230a and a metal layer pattern 220a on the first insulating interlayer pattern 210a and the contact pads 346. In an example, the etch stop layer pattern 230a and the metal layer pattern 220a may be formed by a dry etching process. The etch stop layer 230 may be used for forming a contact electrode 260 (e.g., see FIG. 14) having a uniform height to enhance electrical characteristics of the phase-change semiconductor device. Adjacent metal layer patterns 220a may be isolated from each other with an opening exposing a portion of the first insulating interlayer pattern 210a. The first photoresist pattern 232 may be reduced (e.g., removed) by an ashing process and/or a stripping process.

In the example embodiment of FIG. 12, a second insulating interlayer covering the metal layer pattern 220a may be formed on the etch stop layer pattern 230a to at least partially fill the opening. The second insulating interlayer may include an oxide with one or more of BPSG, PSG, USG, SOG, TEOS, etc. In an example, the second insulating interlayer may be formed by a CVD process, a PE-CVD process, an ALD process and/or an HDP-CVD process. The second insulating interlayer may be at least partially reduced (e.g., removed) until the etch stop layer pattern 230a may be exposed so as to form a second insulating interlayer pattern 240a on the first insulating interlayer pattern 210a. In an example, the second insulating interlayer may be at least partially reduced (e.g., removed) by a chemical mechanical polishing (CMP) process, an etch back process or a combination process of CMP and etch back.

In the example embodiment of FIG. 12, the etch stop layer pattern 230a may be used as a stopper in the planarization process for forming the second insulating interlayer pattern 240a for at least partially filling the opening. In an example, the etch stop layer pattern 230a may not be used as an etching mask in an etching process for forming the metal layer pattern 220a. In another example, the etch stop layer pattern 230a may have a thickness below the upper thickness threshold (e.g., about 3,000 Å) such that a thickness of a third insulation layer 250 (e.g., see FIG. 13) may be controlled with greater precision. For example, the etch stop layer pattern 230a may have a thickness between about 100 Å and about 2,000 Å. In a further example, the etch stop layer pattern 230a may have a thickness between about 200 Å and about 1,500 Å.

Figure 13:
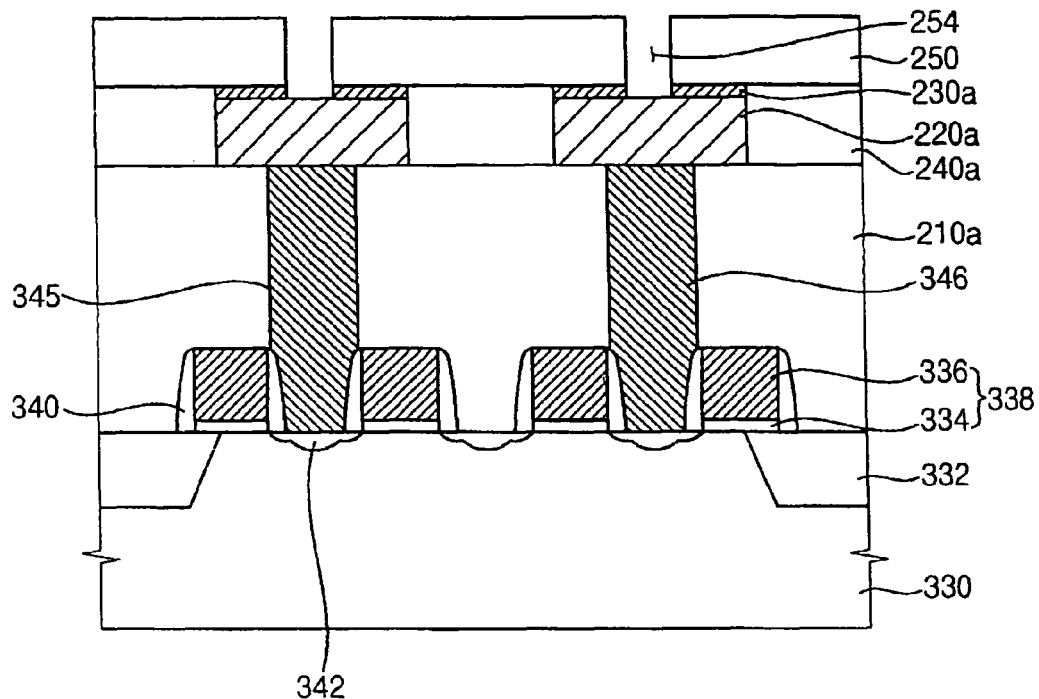

In the example embodiment of FIG. 13, a preliminary third insulating interlayer may be formed on the etch stop layer pattern 230a and the second insulating interlayer pattern 240a. A second photoresist pattern (not shown) may be formed on the preliminary third insulating interlayer. The preliminary third insulating interlayer and the etch stop layer pattern 230a may be dry etched using the second photoresist pattern as an etching mask to form a contact hole 254 exposing a portion of the metal layer pattern 220a. A third insulating interlayer 250 including the contact hole 254 may be formed on the etch stop layer pattern 230a and the second insulating interlayer pattern 240a. The second photoresist pattern may be reduced (e.g., removed) by an ashing process and/or a stripping process.

Figure 14:
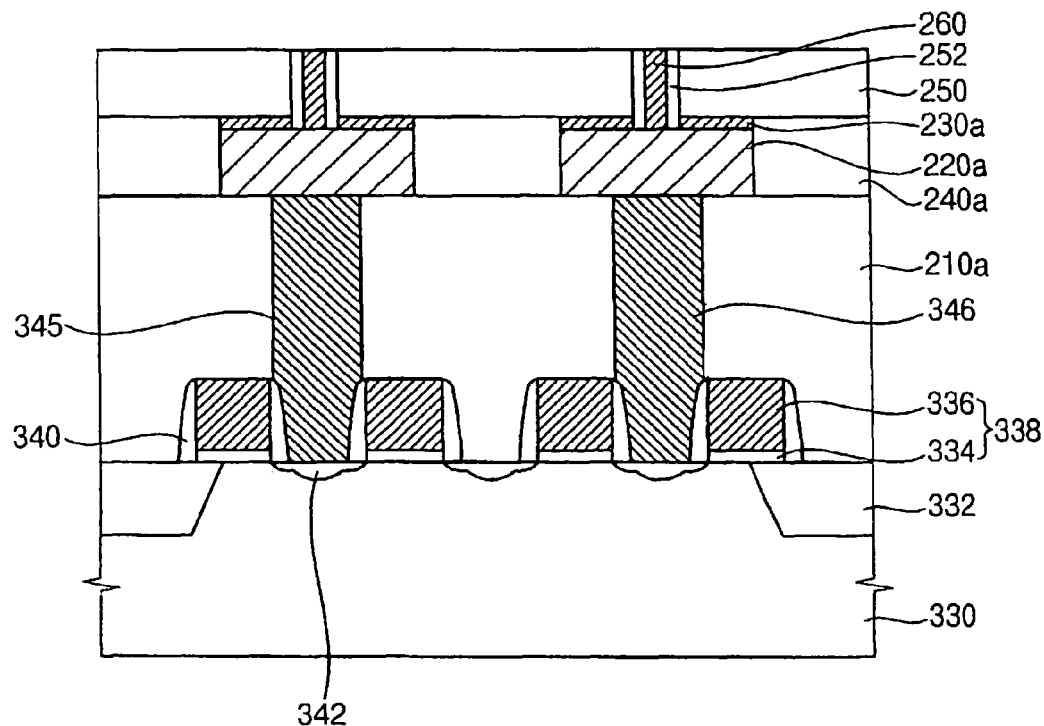

In the example embodiment of FIG. 14, a spacer 252 and a contact electrode 260 may be formed through the etch stop layer pattern 230a and the third insulating interlayer 250 to at least partially fill the contact hole 254. The contact electrode 260 may contact the metal layer pattern 220a. An insulation layer may be formed on the third insulating interlayer 250 and the insulation layer may be at least partially reduced (e.g., removed) by an etch back process to form the spacer 252 on a sidewall of the contact hole 254. After a formation of the spacer 252, a conductive layer may be formed on the third insulating interlayer 250 to at least partially fill the contact hole 254. The conductive layer may be reduced (e.g., partially removed) until an upper face of the third insulating interlayer 250 may be exposed. In an example, the conductive layer may be reduced (e.g., partially removed) by a CMP process, an etch back process or a combination process of CMP and etch back. Accordingly, the contact electrode 260 may be formed to at least partially fill the contact hole 254. The spacer 252 may surround the contact electrode 260. In an example, the contact electrode 260 may include a conductive material substantially the same as the conductive material included within the contact electrode 160 described above with reference to the example embodiment of FIG. 7.

Figure 15:
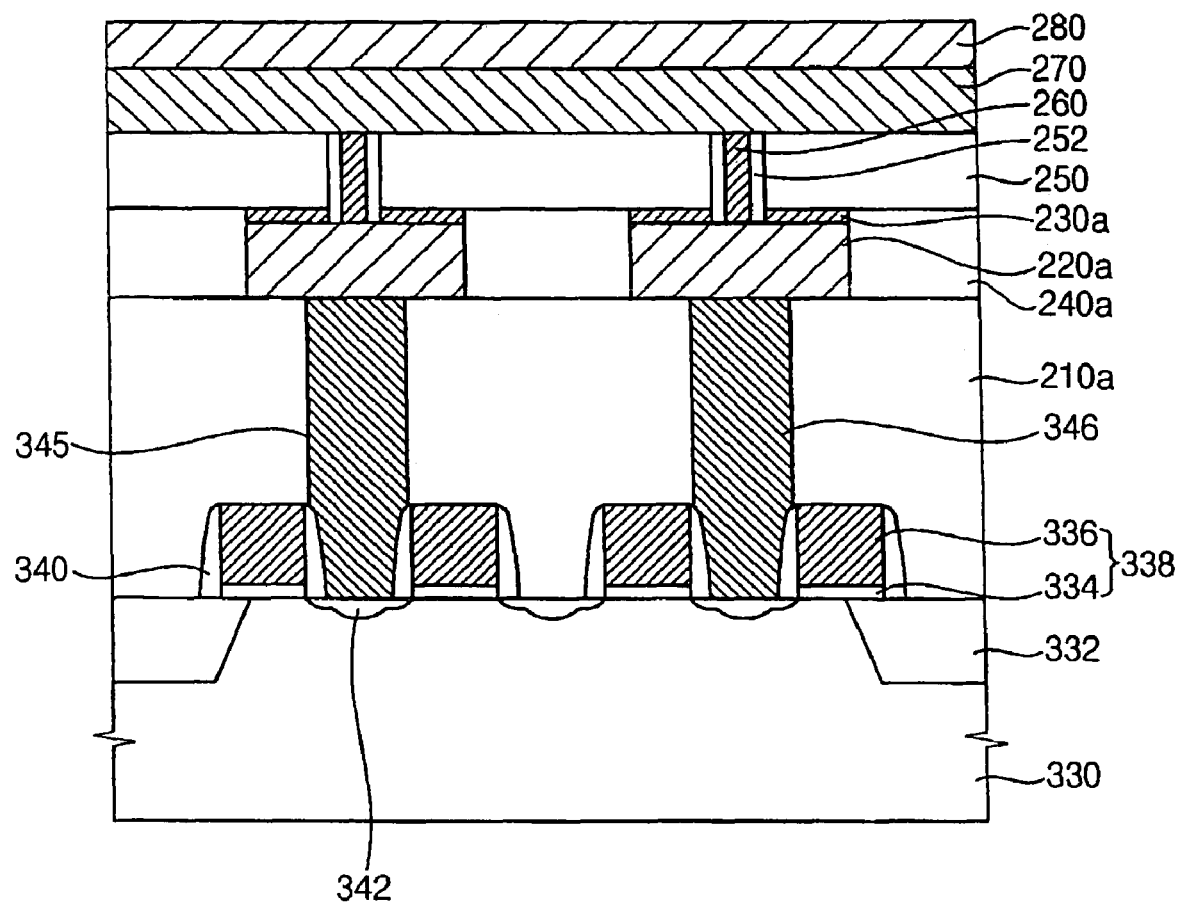

In the example embodiment of FIG. 15, a phase-change layer 270 may be formed on the third insulating interlayer 250 including the contact electrode 260 surrounded by the spacer 252. In an example, the phase-change layer 270 may include a chalcogenide alloy by a sputtering process. Examples of the chalcogenide alloy have been described above with respect to the example embodiment of FIG. 8, and therefore a further detailed description of chalcogenide alloy examples have been omitted for the sake of brevity.

In the example embodiment of FIG. 15, an upper electrode layer 280 may be formed on the phase-change layer 270 by a CVD process, a PVD process and/or an ALD process. In an example, the upper electrode layer 280 may be formed with a conductive material including one or more of a nitrogen-containing conductive material, metal and metal silicide. Examples of the conductive material have been described above with respect to the example embodiment of FIG. 8, and therefore a further detailed description of conductive material examples have been omitted for the sake of brevity.

Figure 16:
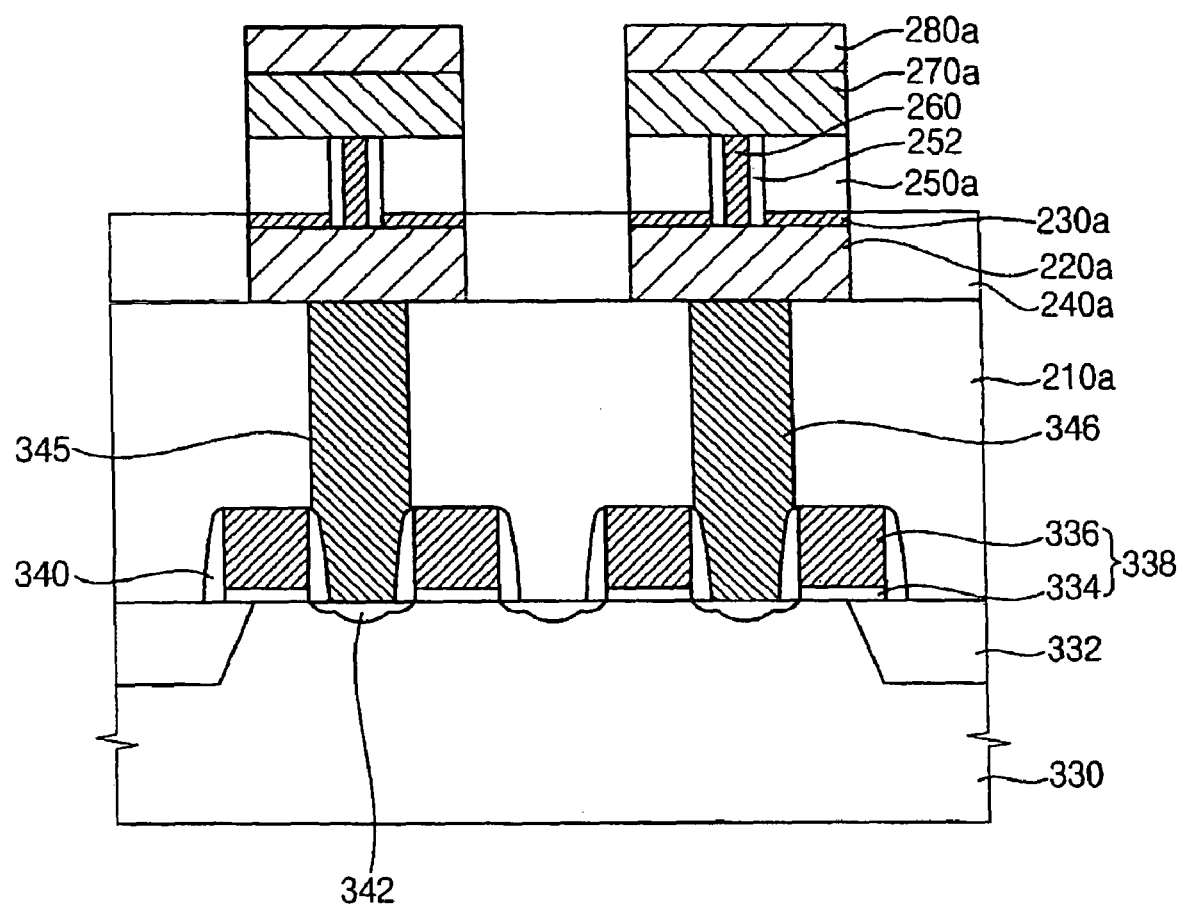

In the example embodiment of FIG. 16, an etching mask (not shown) may be formed on the upper electrode layer 280. The upper electrode layer 280, the phase-change layer 270, and the third insulating interlayer 250 may be patterned using the etching mask to form a upper electrode 280a, a phase-change layer pattern 270a and a third insulating interlayer pattern 250a on the etch stop layer pattern 230a to form a phase-change memory cell.

In the example embodiment of FIG. 16, the phase-change memory cell may include the contact electrode 260 formed through the third insulating interlayer pattern 250a, the spacer 252 surrounding the contact electrode 260, the phase-change layer pattern 270a formed on the contact electrode 260 and the third insulating interlayer pattern 250a, and the upper electrode 280a formed on the phase-change layer pattern 270a. Additionally, a fourth insulation layer may be formed on the upper electrode 280a to electrically isolate adjacent upper electrodes 280a from each other.

In another example embodiment of the present invention, a metal layer pattern may be formed by etching a metal layer using a photoresist pattern. An etch stop layer (e.g., with a thickness below an upper thickness threshold) may be formed on the metal layer pattern. The etch stop layer may be used to attain a contact electrode having a desired height. A thickness of an insulation layer formed on the etch stop layer may be controlled with higher levels of precision, and a height of the contact electrode may be adjusted. The contact electrode may thereby be formed with a desired electrical resistance with a uniform height, thereby improving electrical characteristics (e.g., a performance of programming and/or erasing operations) of a phase-change device.

Example embodiments of the present invention being thus described, it will be obvious that the same may be varied in many ways. For example, while the above-described example embodiments include references to particular layer orders, it is understood that such layer arrangements are given for example purposes only, and other example embodiments of the present invention may be directed to other arrangements. For example, additional intervening layers may be formed in other example embodiments of the present invention.

Further, the phase-change layers 170/270 and/or phase-change layer patterns 170a/270a may be made of a transition metal oxide having multiple resistance states, as described above. For example, the phase-change layers 170/270 and/or phase-change layer patterns 170a/270a may be made of at least one material selected from the group consisting of NiO, $TiO_2$, HfO, $Nb_2O_5$, ZnO, $WO_3$, and CoO or GST ($Ge_2Sb_2Te_5$) or PCMO($Pr_xCa_{1-x}MnO_3$). The phase-change layers 170/270 and/or phase-change layer patterns 170a/270a may include a chemical compound including one or more elements selected from the group consisting of S, Se, Te, As, Sb, Ge, Sn, In and Ag.

In some example embodiments, as discussed above, the phase-change layers 170/270 and/or phase-change layer patterns 170a/270a may include chalcogenide alloys such as germanium-antimony-tellurium (Ge—Sb—Te), arsenic-antimony-tellurium (As—Sb—Te), tin-antimony-tellurium (Sn—Sb—Te), or tin-indium-antimony-tellurium (Sn—In—Sb—Te), arsenic-germanium-antimony-tellurium (As—Ge—Sb—Te). Alternatively, the phase-change layers 170/

270 and/or phase-change layer patterns 170a/270a may include an element in Group V A-antimony-tellurium such as tantalum-antimony-tellurium (Ta—Sb—Te), niobium-antimony-tellurium (Nb—Sb—Te) or vanadium-antimony-tellurium (V—Sb—Te) or an element in Group VA-antimony-selenium such as tantalum-antimony-selenium (Ta—Sb—Se), niobium-antimony-selenium (Nb—Sb—Se) or vanadium-antimony-selenium (V—Sb—Se). Further, the data storage layer may include an element in Group VIA-antimony-tellurium such as tungsten-antimony-tellurium (W—Sb—Te), molybdenum-antimony-tellurium (Mo—Sb—Te), or chrome-antimony-tellurium (Cr—Sb—Te) or an element in Group VIA-antimony-selenium such as tungsten-antimony-selenium (W—Sb—Se), molybdenum-antimony-selenium (Mo—Sb—Se) or chrome-antimony-selenium (Cr—Sb—Se).

Although the phase-change layers 170/270 and/or phase-change layer patterns 170a/270a are described above as being formed primarily of ternary phase-change chalcogenide alloys, the chalcogenide alloy of the phase-change layers 170/270 and/or phase-change layer patterns 170a/270a could be selected from a binary phase-change chalcogenide alloy or a quaternary phase-change chalcogenide alloy. Example binary phase-change chalcogenide alloys may include one or more of Ga—Sb, In—Sb, In—Se, $Sb_2$—$Te_3$ or Ge—Te alloys; example quaternary phase-change chalcogenide alloys may include one or more of an Ag—In—Sb—Te, (Ge—Sn)—Sb—Te, Ge—Sb—(Se—Te) or $Te_{81}$—$Ge_{15}$—$Sb_2$—$S_2$ alloy, for example.

Such variations are not to be regarded as departure from the spirit and scope of example embodiments of the present invention, and all such modifications as would be obvious to one skilled in the art are intended to be included within the scope of the following claims.

What is claimed is:

1. A phase-change semiconductor device, comprising:
an insulation layer over a substrate;
a metal layer pattern on the insulation layer, the metal layer pattern including an opening that exposes a portion of the insulation layer;
an etch stop layer formed on an upper face and sidewalls of the metal layer pattern and the exposed portion of the insulating layer, the etch stop layer formed with a thickness less than an upper thickness threshold;
a conductive path formed in an opening in the etch stop layer and the metal layer pattern, the conductive path providing an electrical connection to the substrate; and
a phase change layer pattern electrically connected to the conductive path.

2. The phase-change semiconductor device of claim 1, wherein the upper thickness threshold is about 3,000 Å.

3. The phase-change semiconductor device of claim 1, wherein the etch stop layer has a thickness between about 100 Å to about 2,000 Å.

4. The phase-change semiconductor device of claim 1, wherein the etch stop layer includes at least one of silicon nitride, silicon oxynitride and silicon-rich silicon oxide.

* * * * *